(12) United States Patent
Agassi

(10) Patent No.: US 6,635,368 B1
(45) Date of Patent: Oct. 21, 2003

(54) HTS FILM-BASED ELECTRONIC DEVICE CHARACTERIZED BY LOW ELF AND WHITE NOISE

(75) Inventor: Yehoshua Dan Agassi, Silver Spring, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/022,340

(22) Filed: Dec. 20, 2001

(51) Int. Cl.$^7$ .......................... H01B 12/00; H01L 39/22; H01L 39/24; H01L 27/00; H01L 29/00
(52) U.S. Cl. ..................... 428/701; 505/190; 505/191; 505/211; 505/220; 505/230; 505/701
(58) Field of Search .................................. 428/701, 930, 428/567, 615, 98, 141, 195, 210, 221, 357, 697; 505/190, 191, 193, 211, 220, 230, 701, 702, 703, 832, 838; 174/125.1, 250; 257/661, 662, 663

(56) References Cited

U.S. PATENT DOCUMENTS

| | | | |
|---|---|---|---|
| 4,181,902 A | | 1/1980 | Scott |
| 5,420,103 A | | 5/1995 | Oishi et al. |
| 5,428,005 A | * | 6/1995 | Matsuura et al. ........... 505/234 |
| 5,430,012 A | | 7/1995 | Nakamura et al. |
| 5,430,014 A | * | 7/1995 | Soltner et al. .............. 505/238 |
| 5,512,541 A | * | 4/1996 | Konishi et al. ............. 505/474 |
| 5,567,674 A | * | 10/1996 | Inada et al. ................. 505/475 |
| 5,593,950 A | | 1/1997 | Mukaida et al. |
| 5,627,139 A | * | 5/1997 | Chin et al. .................. 505/238 |
| 5,677,264 A | | 10/1997 | Suh et al. |
| 5,716,908 A | | 2/1998 | Kawamoto et al. |
| 5,729,046 A | | 3/1998 | Nishino et al. |
| 5,856,275 A | * | 1/1999 | Inada et al. ................. 505/220 |
| 5,885,939 A | | 3/1999 | Matsunaga et al. |
| 6,083,884 A | | 7/2000 | Young et al. |
| 6,156,706 A | | 12/2000 | Divin et al. |
| 2001/0017220 A1 | | 8/2001 | Nakahara et al. |

OTHER PUBLICATIONS

M. Tachiki and S. Takahashi, "Strong Vortex Pinning Intrinsic in High–$T_c$ Oxide Superconductors," *Solid State Communication* 70, No. 3, pp 291–295 (1989).

M. Tachiki and S. Takahashi, "Anisotropy of Critical Current in Layered Oxide Superconductors," *Solid State Communication* 72, No. 11, pp 1083–1086 (1989).

M. Tachiki and S. Takahashi, "Intrinsic Pinning in Cuprate Superconductors," *Applied Superconductivity* 2, No. 3/4, pp 305–313 (1994).

R. Tsuchiya et. al., "$YBa_2Cu_3O_{7-\delta}$ Trilayer Junction With nm Thick $PrGaO_3$ Barrier," *App. Phys. Lett.* 71(11), pp 1570–1572 (Sep. 1997).

(List continued on next page.)

*Primary Examiner*—Tom Dunn
*Assistant Examiner*—Colleen P. Cooke
(74) *Attorney, Agent, or Firm*—Howard Kaiser

(57) ABSTRACT

A film-based HTS device comprises a substrate and a superconducting film. A peripheral portion of the film is a-axis-aligned material which is so situated on the substrate as to describe a-b planar barriers which are perpendicular to the substrate and which in parallel fashion border upon the entire periphery of the film. The a-b planar barriers serve to block vortices which nucleate at the film's periphery, thereby attenuating the overall vortex activity associated with the film, thereby attenuating the ELF and white noise which are normally prevalent in superconductor devices. Effectiveness in terms of arresting vortex motion may be increased by providing an interior film portion which is also a-axis-aligned material. It may be preferable to provide an interior film portion which is c-axis-aligned material, since this is easier to make and the a-axis-aligned peripheral portion of the film will be sufficiently effective in terms of "pinning" the vortices.

25 Claims, 5 Drawing Sheets

OTHER PUBLICATIONS

F. Miletto Granozio, M. Salluzzo, U. Scotti di Uccio, I. Iaggio–Aprile and O. Fischer, "Competition between a–axis and c–axis Growth in Superconducting $RBa_2Cu_3O_{7-x}$ Thin Films," *Physica Review B 61*(1), pp. 756–765 (Jan. 1, 2000).

G. Deutscher and D. Racah, "Tunneling Density of States in a–axis YBCO Films," *Proceedings of the SPIE—Int. Soc. Opt. Eng.*, vol. 2696, pp 328–337 (1996).

R. Krupke and G. Deutscher, "Anisotropic Magnetic Field Dependence of the Zero–Bias Anomaly on In–Plane Oriented [100] $Y_1Ba_2Cu_3O_{7-x}$ / In Tunnel Junctions," *Phys. Rev. Lett. 83*, No. 22, pp 4634–4637 (Nov. 29, 1999).

Krupke and G. Deutscher, "Spontaneous and Field Enhanced Sub–Gaps in In–Plane Oriented (100)— $Y_{1-x}Ca_xBa_2Cu_3O_{7-y}$ / In Tunnel Junctions," *Jour. Low Temp. Phys. 117*, Nos. 3/4, pp 533–537 (1999).

I. Takeuchi, P.A. Warburton, Z. Trajanovic, C.J. Lobb, Z.W. Dong, T. Venkatesan, M.A. Bari, W.E. Booij, E.J. Tarte and M.G. Blamire, "Fabrication of In–Plane Aligned a–axis Oriented $YBa_2Cu_3O_{7-x}$ Trilayer Josephson Junctions," *Appl. Phys. Lett. 69* (1), pp 112–114 (Jul. 1, 1996).

J. Mannhart, J.G. Bednorz, A. Catana, Ch. Gerber and D.G. Schlom, "High–$T_c$ Thin Films. Growth Modes—Structure—Applications," *Materials and Crystallographic Aspects of $HT_c$–Superconductivity*, pp 453–470 (1994).

You–song Jiang, Tadayuki Kobayashi and Toshinari Goto, "Josephson Effects in A–axis Oriented $YBa_2Cu_3O_{7-y}$ SIS Tunnel Junctions with Double Layer Barrier," *Physica C 341–348*, pp 2741–2742 (2000).

M. Mukaida et al., "Ln Dependence in $Ln_2CuO_4$ Buffer Layers of c–Axis In–Plane Aligned a–Axis Oriented $YBa_2Cu_3O_{7-\delta}$ Thin Film Growth," *Physica C 357–369* (1–4), pp 1382–1385 (2001).

M. Mukaida et al., "Fabrication and Microstructure of All In–Plane Aligned a–Axis Oriented Superconductor/Insulator/Superconductor Junctions," *Jpn. J. Appl. Phys. 38*, Part 1, No. 3A, pp 1370–1374 (Mar. 15, 1999).

R.G. Wichern et al., "$YBa_2Cu_3O_{7-\delta}$ a–Axis Films and Planar Junctions," *IEEE Trans. Applied Superconductivity 5* (2), pp 2361–2364 (1995).

C. Ballesteros et al., "Relation between Microstructure and Superconducting Properties in a–Axis 123 Films and Superlattices," *Thin Solid Film 373* (1–2), pp 113–116 (Sep. 2000).

N. Tanichi et al., "Terahertz Radiation from a–Axis Oriented YBCO Thin Films," *Physica C 293*, pp 229–233 (1997).

Gun Yong Sung and Jeong Dae Suh, "Nucleation and Growth of b–axis Oriented $PrBa_2Cu_3O_{7-x}$ Thin Films on $LaSrGaO_4$ (100) Substrates," *ETRI Journal*, vol. 18, No. 4, pp 339–346, Jan. 1997.

J.M. Triscone, C.B. Eom, Y. Suzuki and T.H. Geballe, "A–axis Oriented $YBa_2Cu_3O_7/PrBa_2O_7$ Superlattices: Growth and Transport Properties" *J. Alloys and Compounds 183*, starting p 224 (1992). Please note: Abstract only is provided herewith, available at http://www.duke.edu/~eom/Publications/JAC1992.html.

D. Lew, Y. Suzuki, C.B. Eom, M. Lee, J.–M. Triscone, T.H. Geballe and M.R. Beasley, "Vertical Transport Properties of A–axis Oriented $YBa_2Cu_3O_7/PrBa_2Cu_3O_7/YBa_2Cu_3O_7$ Sandwich Junctions" *Physica C 185–189*, starting p 2553 (1991). Please note: Absract only is provided herewith, available at http://www.duke.edu/~eom/Publications/Physica 1991.html.

C.B. Eom, A.F. Marshall, J.M. Triscone, B. Wilkins, S.S. Laderman and T.H. Geballe, "A–axis Oriented $YBa_2Cu_3O_7/PrBa_2Cu_3O_7$ Superlattices," *Science 251*, starting p 780 (1990). Please note: Abstract only is provided herewith, available at http://www.duke.edu/~eom/Publications/Science 1991.html.

C.B. Eom, A.F. Marshall, S.S. Laderman, R.D. Jacowitz and T.H. Geballe, "Epitaxial and Smooth Films of a–axis $YBa_2Cu_3O_7$," *Science 249*, starting p 1549 (1990). Please note: Abstract only is provided herewith, available at http://www.duke.edu/~eom/Publications/Science 1990.html.

John Clarke, "Superconductivity: A Macroscopic Quantum Phenomenon," *Beam Line* (A Periodical of Particle Physics), Stanford Linear Accelerator Center, Stanford, California, Summer/Fall 2000, vol. 30, No. 2, pp 41–48; available on the internet at the Stanford Linear Accelerator Center website, http://www.slac.stanford.edu/; http://www.slac.stanford.edu/, 2 pp; http://www.slac.standord.edu/pubs/beamline, 2 pp; printed out Dec. 03, 2001.

D. Agassi and J.R. Cullen, "Superconductor Strip Geometrical Barrier in the Presence of a Normally Incident Weak Field," *Physica C 341–348*, pp 1257–1258 (Nov. 2000).

D. Agassi and J.R. Cullen, "Single–Vortex Structure in a Superconductor Film and Strip," *Physica C 334*, pp 274–282 (2000).

D. Agassi and J.R. Cullen, "Superconductor Strip Geometrical Barrier in the Presence of a Weak Applied Field," *Physica C 334*, pp 259–273 (2000).

D. Agassi and J.R. Cullen, "Superconductor Strip Response to a Normally Incident Magnetic Field," *Physica C 323*, pp 94–106 (1999).

D. Agassi and J.R. Cullen, "New Vortex State in the Presence of a long Josephson Junction," *Physica C 316*, pp 1–12 (1999).

* cited by examiner

HTS FILM-BASED ELECTRONIC DEVICE CHARACTERIZED BY LOW ELF AND WHITE NOISE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to HTS (high-temperature superconductor) film-based electronic devices, more particularly to types and configurations of HTS films in such devices.

Thin film configurations and thin stripe (elongated thin film) configurations are at the core of all electronic HTS-based applications, such as magnetic-field SQUID (superconducting quantum interference device) sensors, frequency mixers, video-sensors and filters. These films and stripes are universally grown as "c-axis-aligned" HTS films (also referred to herein as "c-axis" HTS films); that is, the c-axis of the anisotropic HTS crystal structure is oriented normal to the substrate surface. Consequently, the superconductivity-sited planes (i.e., the planes which are believed to be the sites of superconductivity) in the HTS crystal structure lie in parallel to the substrate surface. Therefore, for the common configuration of an external magnetic field oriented normal to the film's surface, the associated vortices cut normal to and across all superconductivity-sited planes in the film.

Thermal random motion of such vortices is associated with the observed voltage noise in these films. In the alignment of vortices and the superconductivity-sited planes, it is difficult to arrest that random motion, since there are no intrinsic crystal defects parallel to the c-axis to "pin" it down. The ubiquitous extrinsic grain and twin boundaries pinning centers which do run parallel to the c-axis are too sparsely distributed to limit this random motion effectively. This is believed to qualitatively explain the observed white noise and the substantial low frequency 1/f-like (ELF, or extremely low frequency) noise in HTS-film based electronic apparatuses such as a SQUIDs. This noise, in turn, is a major sensitivity-limiting factor in SQUIDs and other electronic devices configured of stripes and thin films.

SUMMARY OF THE INVENTION

In view of the foregoing, it is an object of the present invention to provide method and apparatus for reducing the white and 1/f-like low-frequency (<100Hz) voltage-noise in High Temperature Superconductor (HTS) film-based electronic devices such as SQUIDs, mixers, video-sensors and filters.

The present invention provides the combination of a film and substrate wherein such combination is adaptable to use in (e.g., as included in or as part of) film-based HTS electronic apparatus so as to attribute such apparatus with low ELF noise and low white noise. The present invention also provides a high-temperature superconductor (HTS) film-based electronic device, which is inclusive of an inventive film-and-substrate combination and is consequently characterized by low extremely low frequency (ELF) noise and low white noise. According to many embodiments of this invention, the inventive film-based HTS so electronic device is a SQUID which is thus characterized by low ELF noise and low white noise.

In accordance with the present invention, "a-axis-aligned" HTS films (also referred to herein as "a-axis" HTS films) are used, instead of the conventionally used c-axis-aligned HTS films, in HTS-based electronic devices. The term "film," as used herein, refers to a superconductive thin film of any outline shape, elongate (stripe-like) or otherwise. Some inventive embodiments provide a film-and-substrate combination wherein the entire HTS film is a-axis-aligned film configured in a homogenous manner. Other inventive embodiments provide a film-and-substrate combination wherein the HTS film is configured in a heterogeneous manner, referred to herein as "patterned."

An inventively patterned HTS film can be an entirely a-axis-aligned film which is configured in at least two different ways; for instance, an inventively "intra-patterned" HTS film can include one or more a-axis-aligned film areas characterized by a first crystalline orientation relative to the substrate surface, and one or more a-axis-aligned areas characterized by a second crystalline orientation relative to the substrate surface. Alternatively, an inventively patterned HTS film can be partially a-axis-aligned film and partially c-axis-aligned film; for instance, an inventively "inter-patterned" HTS film can include one or more a-axis-aligned film areas and one or more c-axis-aligned areas. An inventively patterned HTS film can be both "intra-pattered" and "inter-patterned"; for instance, it is possible that two or more a-axis-aligned film areas differ from each other and/or two or more c-axis-aligned film areas differ from each other. Many inventively patterned HTS films adopt a preferred configuration whereby a-axis-aligned film is disposed along the film's periphery (or at least a portion thereof) so as to serve as a barrier to inward vortex advancement or penetration from the film's periphery.

In the realm of HTS-film-based electronic devices, the present invention's homogeneous a-axis film-and-substrate embodiments and patterned a-axis film-and-substrate embodiments (either a-axis-plus-a-axis embodiments or a-axis-plus-c-axis embodiments) are both advantageous as compared with c-axis film embodiments. Generally, in accordance with inventive practice of a-axis film, whether homogeneous or patterned, the vortex penetration and motion—both thermal and current-induced—is drastically impeded. It has been recognized early on in the superconductivity field that the a-b-planar Cu—O planes in the HTS crystal structure are characterized by superior pinning capacity (for vortices parallel to the a-b planes). However, according to conventional practice, the YBCO is used in a c-axis film capacity, so that the Cu—O planes are not brought to bear on the vortices.

In essence, the present invention effects a ninety-degree shift in orientation of the superconductor lattice relative to the substrate surface. This invention turns the YBCO molecules "on their side," so to speak, in relation to the plane defined by the substrate surface; therefore, the a-b-planar Cu—O planes existing in the YBCO molecules will be rendered in such orientation relative to the substrate surface as to be brought to bear on the vortices.

It has been observed that the a-b planes quite densely populate the superconductor molecules, and hence the a-b planes potentially are especially effective inhibitors of vortex activity; indeed, the extremely high density of the a-b planes in the HTS layered structure renders them ideal vortex-motion inhibitors. The veracity of the observation that the a-b planes have great vortex-inhibitive efficacy has been recently reconfirmed in connection with "coated conductors," the "second generation" HTS high-quality films. The present invention's a-aligned film automatically takes advantage of this fundamental property of a-b planes in association with the motion of vortices. Consequently, vortex penetration, transversal motion (to the current direction) and the associated thermal voltage noise are minimized to the maximum, or practically so, by inventive practice.

The following United States patents are incorporated herein by reference: Divin et al. U.S. Pat. No. 6,156,706 issued Dec. 5, 2000; Young et al. U.S. Pat. No. 6,083,884 issued Jul. 4, 2000; Matsunaga et al. U.S. Pat. No. 5,885,939 issued Mar. 23, 1999; Nishino et al. U.S. Pat. No. 5,729,046 issued Mar. 17, 1998; Kamamoto et al. U.S. Pat. No. 5,716,908 issued Feb. 10, 1998; Suh et al. U.S. Pat. No. 5,677,264 issued Oct. 14, 1997; Mukaida et al. U.S. Pat. No. 5,593,950 issued Jan. 14, 1997; Nakamura et al. U.S. Pat. No. 5,430,012 issued Jul. 4, 1995; Oishi et al. U.S. Pat. No. 5,420,103 issued May 30, 1995. Also incorporated herein by reference is Nakahara et al. U.S. Patent Application Publication US2001/0017220 A1 published Aug. 30, 2001.

According to frequent inventive practice, "patterned" film embodiments are so configured as to set up a barrier around all or almost all of the entire periphery of the film. Thus, many embodiments of the present invention provide apparatus adaptable to utilization as included in a superconductor device, wherein the apparatus comprises a-axis superconducting film and a substrate therefor. The a-axis superconducting film at least substantially describes a border and has a-b planar submolecular crystalline structures which are at least substantially normal to the substrate. The a-b planar submolecular structures are so arranged as to form partitioning means which at least substantially lines the border and which is at least substantially parallel to the border. According to many such inventive embodiments, the apparatus further comprises c-axis superconducting film which is at least substantially interior of the a-axis superconducting film.

Other objects, advantages and features of this invention will become apparent from the following detailed description of the invention when considered in conjunction with the accompanying drawings.

BRIEF DESCRIPTION OF THE DRAWINGS

In order that the present invention may be clearly understood, it will now be described, by way of example, with reference to the accompanying drawings, wherein like numbers indicate the same or similar components, and wherein.

DETAILED DESCRIPTION OF THE INVENTION

Figure 1:
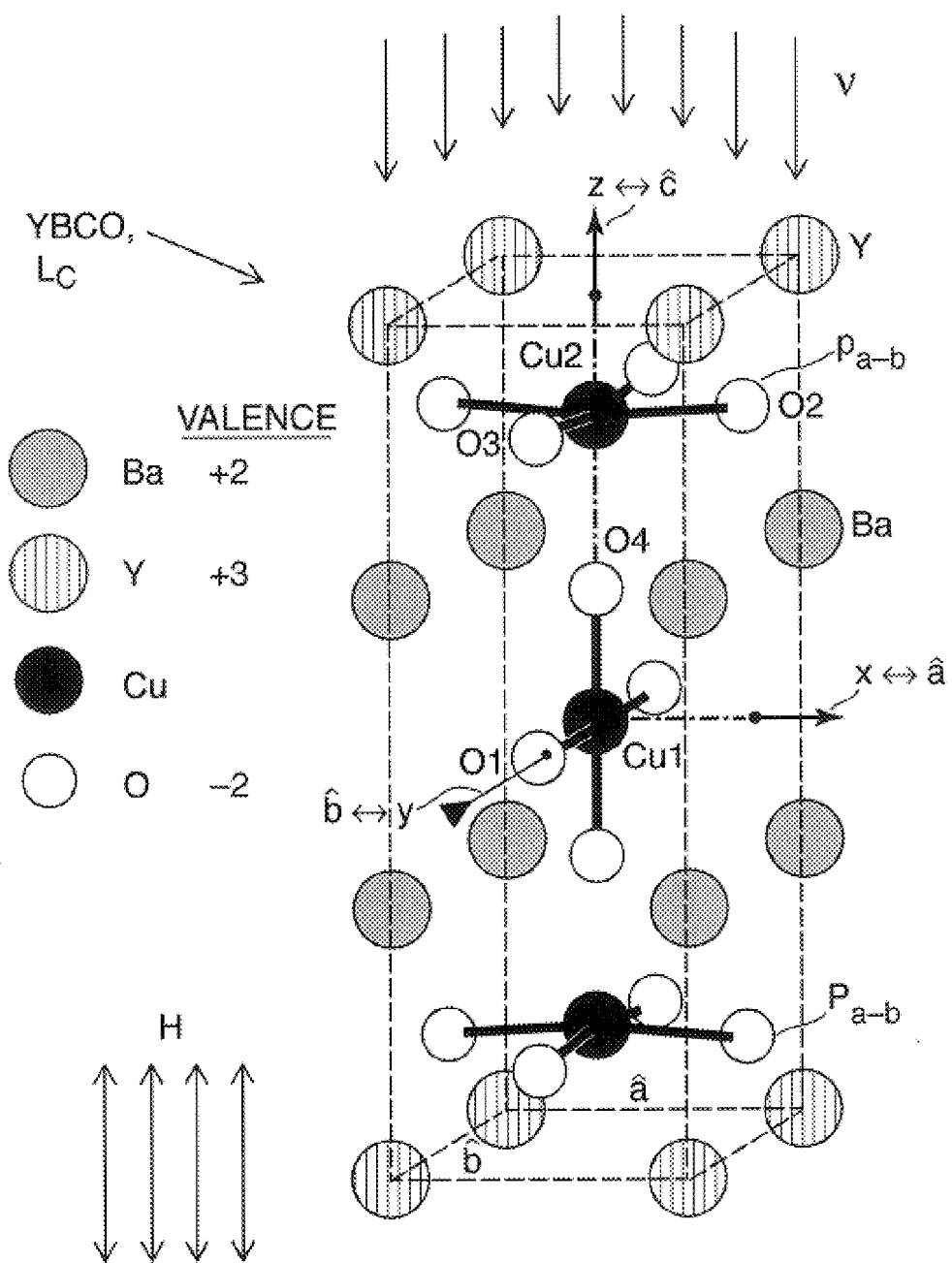
FIG. 1 is a diagrammatic perspective molecular view of the atomic arrangement of a single $YBa_2Cu_3O_{7-\delta}$ (abbreviatedly referred to herein as "YBCO") crystalline structure which typifies a HTS crystalline structure which may be used as a c-axis film in an HTS film-based electronic device. Further, the single YBCO crystal is diagrammatically shown in juxtaposition with respect to a substrate to illustrate conventional practice wherein c-axis-aligned YBCO film is disposed upon a substrate.
Figure 1:
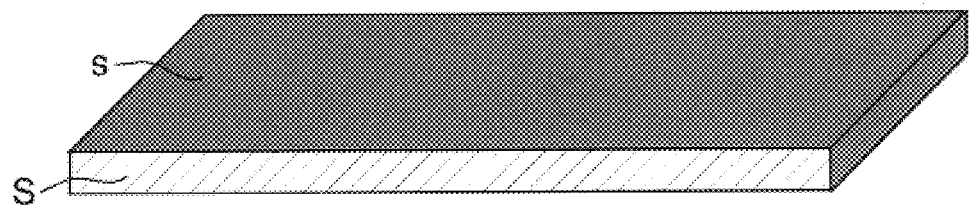

Referring now to FIG. 1, $YBa_2CU_3O_{7-\delta}$("YBCO") is a typical HTS crystal structure which is conventionally used as a c-axis film $L_c$ in an HTS film-based electronic device. The a-axis a, the b-axis b and the c-axis c are equivalent, in geometric space, to the x-axis, y-axis and z-axis, respectively. The c-axis c of the anisotropic HTS crystal structure is oriented normal (perpendicular) to the surface s of substrate S. Hence, the a-b-planar Cu—O planes $p_{a-b}$ in the HTS crystal structure, which are believed to be the sites of superconductivity, lie in parallel to the substrate surface S. Thus, for the typical configuration of an external magnetic field (represented by lines H) oriented normal to the film's surface, the associated vortices v cut normal to and across all Cu—O (superconductivity-sited) planes $p_{a-b}$ in the film $L_c$.

In the particular alignment shown in FIG. 1 of the vortices v and the Cu—O (a-b-planar, superconductivity-sited) planes $p_{a-b}$, it is difficult to arrest the thermal random motion of such vortices v which is associated with the observed voltage noise in the films; this is due to the absence of crystalline structure (e.g., crystal defects) parallel to the c-axis c which would serve to "pin down" the thermal random motion. Running parallel to the c-axis c are the ubiquitous extrinsic grain and twin boundaries pinning centers; however, these are too sparsely distributed to limit this random motion effectively. It is believed that these vortex-related phenomena provide a qualitative explanation for high white voltage-noise and the high ELF (low frequency 1/f-like) voltage-noise in HTS-film based electronic devices characterized by stripes and thin films; such noise represents a significant limiting factor in such electronic devices in terms of sensitivity.

Figure 2:
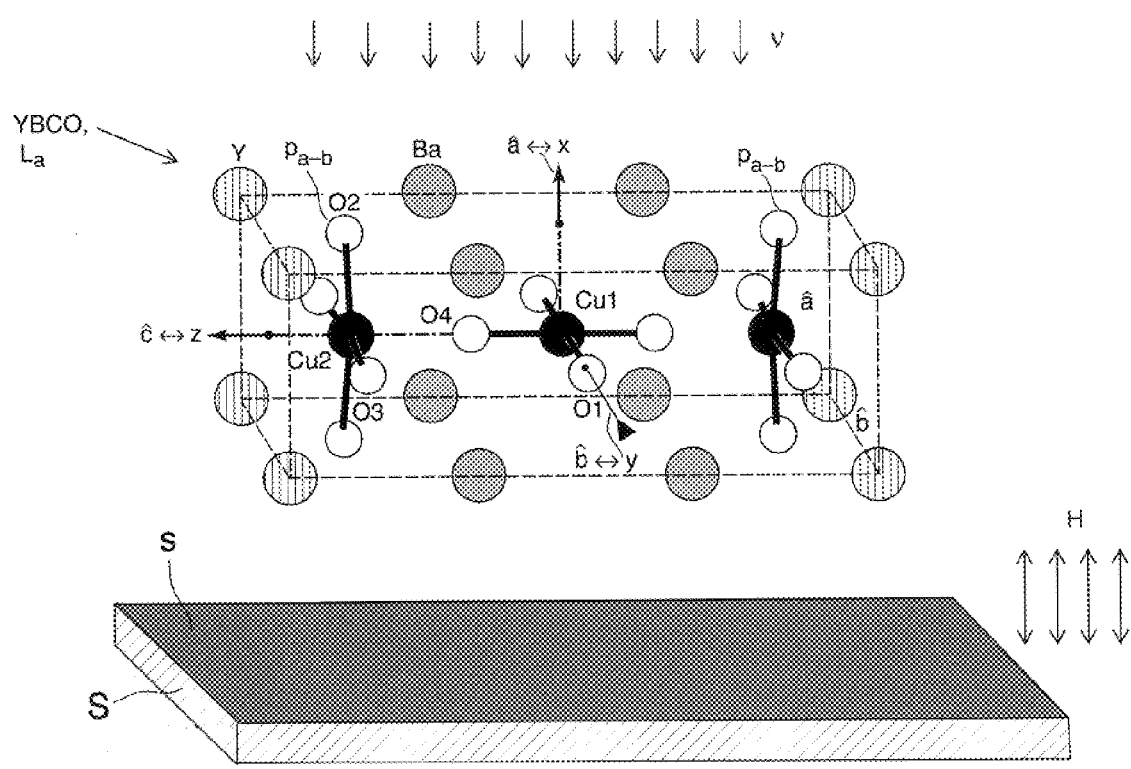
FIG. 2 is the diagrammatic perspective molecular view of the single YBCO crystalline structure shown in FIG. 1. Further, the single YBCO crystal is diagrammatically shown in juxtaposition with respect to a substrate to illustrate practice, in accordance with the present invention, wherein a-axis-aligned YBCO film is disposed upon a substrate.
Figure 3:
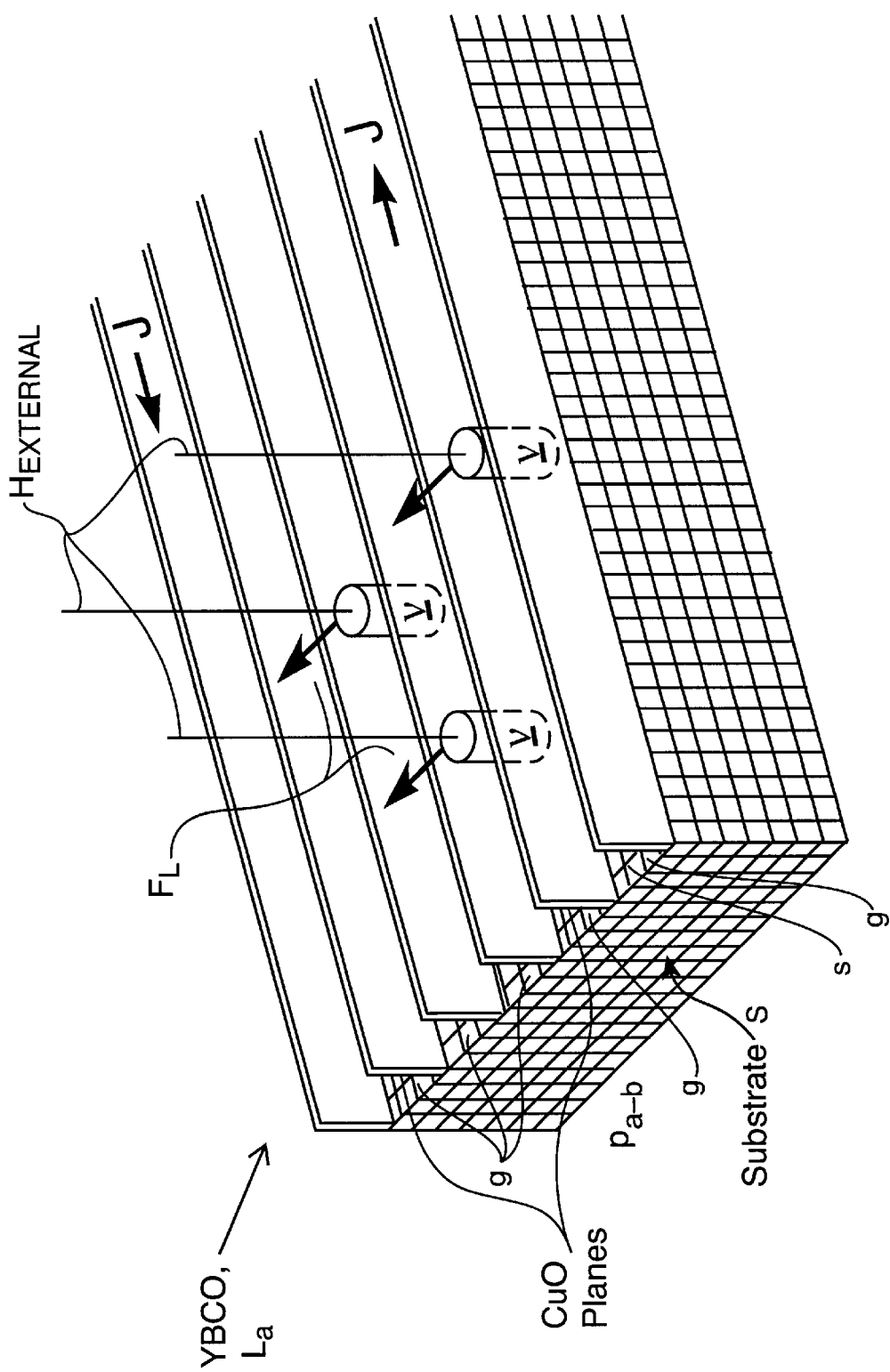
FIG. 3 is a diagrammatic partial perspective view of an embodiment of the combination of an HTS crystalline structure (such as a YBCO crystalline structure) and a substrate in accordance with the present invention, wherein the HTS crystalline structure is inventively used as an a-axis film in HTS film-based electronic devices.
Figure 4:
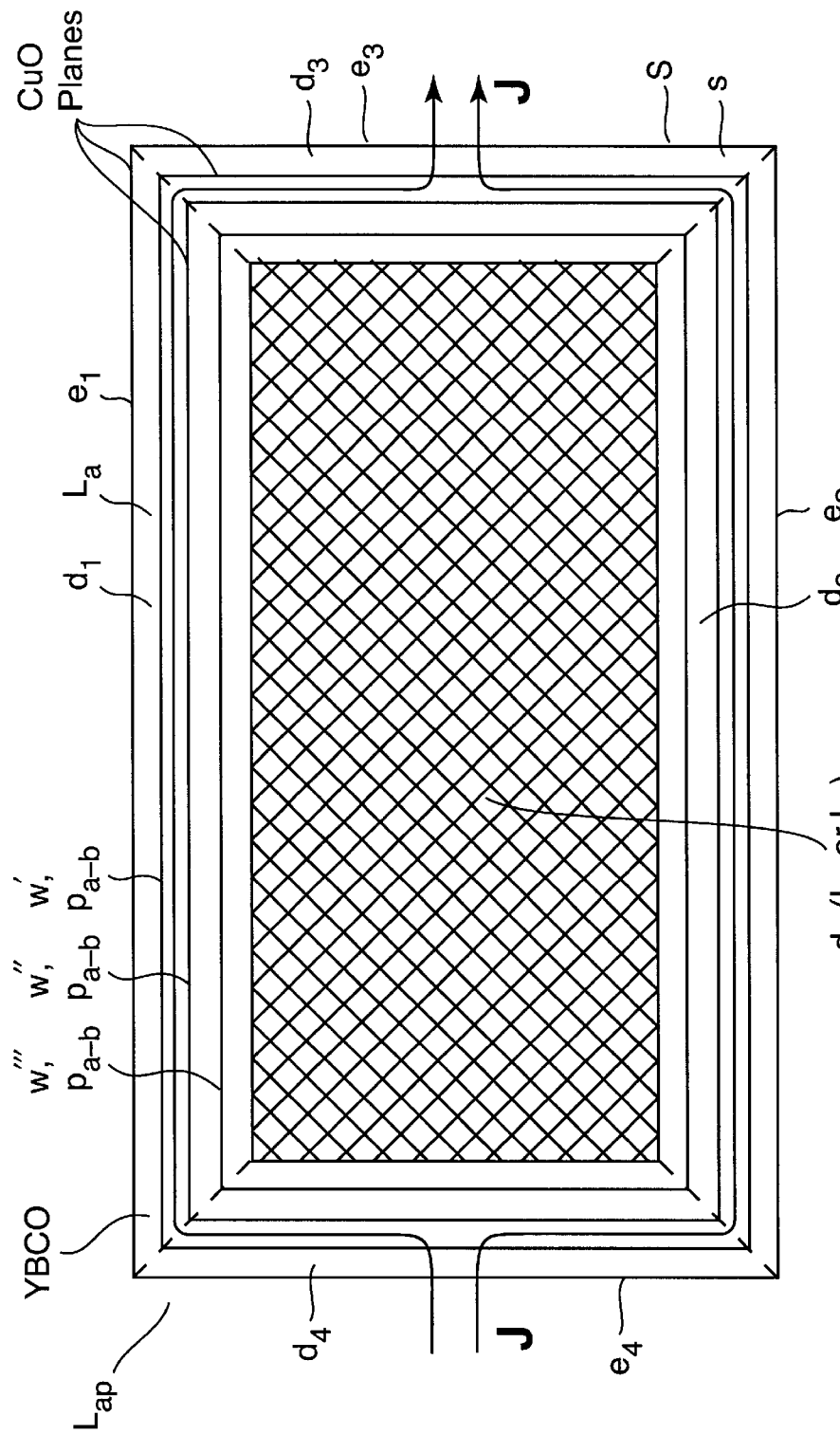
FIG. 4 is a diagrammatic top plan view of another embodiment of the combination of an HTS crystalline structure (such as a YBCO crystalline structure) and a substrate in accordance with the present invention, wherein the HTS crystalline structure is inventively used as an a-axis film in HTS film-based electronic devices.

With reference to FIG. 2 through FIG. 4, the present invention provides for the replacement of the currently used c-axis-aligned films $L_c$ in HTS-based electronic devices with homogeneous a-axis-aligned HTS films $L_a$ (such as shown in FIG. 3) or heterogeneous ("patterned") a-axis-aligned HTS films Lap (such as shown in FIG. 4). As shown in FIG. 2 and FIG. 3, the c-axis c of the anisotropic HTS crystal structure is disposed parallel to the surface s of substrate S. Hence, the a-b-planar Cu—O planes $p_{a-b}$ (the sites of superconductivity) in the HTS film $L_a$ crystal structure are disposed normal (perpendicular) to the substrate surface s. Thus, according to this invention, for the typical configuration of an external magnetic field H oriented normal to the film's surface, the associated vortices v move in a "channeled" or "grooved" fashion in parallel to each other and to the Cu—O planes $p_{a-b}$ in the film. As best illustrated in FIG. 3, the Cu—O planes $p_{a-b}$ define channels or grooves g, thereby serving to constrain or capture the vortex flow of vortices v within and along such channels or grooves g.

In accordance with the present invention, the optimal alignment of an a-axis film $L_a$ (or an a-axis film $L_a$ portion or "domain") with respect to the external magnetic-field and current-flow directions is illustrated in FIG. 2 and FIG. 3. In this configuration, the external magnetic field (represented by lines H) and the ensuing vortices v (represented by cylinders v continuing the filed lines into the body of the film $L_a$) are aligned in parallel to the a-axis a. As shown in FIG. 3, for a current J flowing in the film La predominantly along the Cu—O (superconductivity-sited) planes $p_{a-b}$, the Lorentz force $F_L$ resulting from the current-vortex interaction points in the c-axis c direction. However, such a transversal (to the current flow direction J) vortex motion is strongly inhibited by the intrinsic strong pinning of the Cu—O planes. In qualitative terms, vortices v in this configuration tend to "thread in the grooves" delineated by the Cu—O planes $p_{a-b}$, and hence their motion normal to those planes $p_{a-b}$—whether current-driven or thermal—is strongly inhibited by the strong pinning of these a-b-planar Cu—O planes $p_{a-b}$.

This kind of effect involving the inhibition of vortex motion was predicted and observed some time ago, early after the discovery of HTS materials. See the following references, each of which is incorporated herein by reference: M. Tachiki and S. Takahashi, "Strong Vortex Pinning Intrinsic in High-$T_c$ Oxide Superconductors," *Solid State Communication* 70, No. 3, pp 291–295 (1989); M. Tachiki and S. Takahashi, "Anisotropy of Critical Current in Layered Oxide Superconductors," *Solid State Communication* 72, No. 11, pp 1083–1086 (1989); M. Tachiki and S. Takahashi, "Instrinsic Pinning in Cuprate Superconductors," *Applied Superconductivity* 2, No. 3/4, pp 305–313 (1994). The corresponding pinning force per unit vortex length $f_p$ is given by $$f_P = \frac{H_c^2}{4} a_c \frac{\xi_{ab}}{\xi_c} \eta$$

where $\xi_{\{ab, c\}}$ and $\eta$ denote the (non-isotropic) coherence lengths and a geometrical factor, $a_c$, is the periodicity of the Cu—O planes in the c-axis c direction and $H_c$ is the thermodynamic critical field. When typical HTS numbers are inserted in this formula, critical currents approaching the theoretical-limit of the depairing current are obtained.

Hence, in accordance with the present invention, in the a-axis films and the field-current configuration above transversal, vortex motion—thermal or induced—is strongly suppressed throughout the film. Of particular import, the associated thermal noise is predicted to be strongly suppressed by inventive practice. Longitudinal vortex v motion (along the CuO planes $p_{a-b}$) is not inhibited in this inventive configuration. However, by virtue of Faraday's law, such a motion does not contribute to the measured longitudinal voltage. While the importance of intrinsic pinning has long been known in the abstract, the present invention's application thereof as a means to reducing voltage noise is novel.

Alternative and generally preferable embodiments according to this invention use a patterned (i.e., heterogeneous) HTS film a-axis-aligned HTS films $L_{ap}$, such as illustrated in FIG. 4. A "patterned" film according to the present invention is one which is characterized by plural distinct film "domains" (regions or areas), typically all lying at least approximately in the same imaginary plane defined by the HTS film. The inventively patterned film can be of a kind which is entirely a-axis-aligned film (styled herein, "intra-patterned"), wherein at least two film domains, albeit both a-axis-aligned domains, are distinguishable. Alternatively, the inventively patterned film can be of a kind which is a combination of a-axis-aligned film and c-axis-aligned film (styled herein, "inter-patterned"), wherein at least two domains differ at least in the respect that one film domain is a-axis-aligned film and the other film domain is c-axis-aligned film; these inventive embodiments may be especially useful in situations wherein the growth of a homogeneously aligned a-axis HTS film $L_a$ (such as illustrated in FIG. 3) is not practical.

The example shown in FIG. 4 demonstrates the inventive principle of "patterning" for a rectangular film. Each domain d is an a-aligned domain lying along (in contiguity with and in parallel with) one of the edges e of the rectangularly shaped HTS film $L_{ap}$. In inventive practice, the width of each domain d is typically on the order of O(10) a-b-plane-penetration-lengths or larger. Since vortices v always enter the sample from its periphery (which includes edges e), the abovementioned strong Cu—O-planes $p_{a-b}$ pinning impedes this penetration as much as possible by acting as a barrier or "fire wall."

As exemplified in FIG. 4, rectangular film $L_{ap}$ includes four a-axis-aligned film domains $d_1$, $d_2$, $d_3$ and $d_4$ around the periphery thereof, each domain d corresponding to one of the four linear edges e of rectangular film f. Domains $d_1$ is situated along edge $e_1$, domain $d_2$ is situated along edge $e_2$, domain $d_3$ is situated along edge $e_3$ and domain $d_4$ is situated along edge $e_4$. Centrally located domain $d_5$ is represented in FIG. 4 as a rectangular hatched area. Each domain d is disposed at right angles to the two adjacent domains d. FIG. 4 portrays that each domain d includes an array of three parallel, edgewise a-b plane p barriers w, namely, w', w" and w'". Each planar barrier w is seen "edge-on" from above in FIG. 4. Each a-b plane $p_{a-b}$ corresponds to a single crystal of a-b-aligned YBCO. Each barrier w includes a series of co-planar a-b planes $p_{a-b}$ which connect end-to-end so as to describe an overall planar barrier w. Each domain d is approximately rectangularly shaped. In order to provide more perfect right-angled junctures u of barriers w, domains d are shown to each be trapezoidal whereby adjacent domains d have harmoniously angled ends.

The same inventive principle—viz., that of peripherally blockading vortex motion using a-b planes $p_{a-b}$—can be adapted to other film geometries, whether characterized by rectilinearity and/or curvilinearity. Accordingly, it is to be understood by the ordinarily skilled artisan who reads this disclosure that inventive practice lends itself to a variety of perimetric film shapes, such as circles, ellipses, ovals, polygons having three or more sides (e.g., triangles, squares, short rectangles, long rectangles, pentagons, hexagons, septagons, octagons, nonagons, decagons, etc.), and irregular shapes having at least one curved edge and at least one linear (straight) edge. The present invention's efficacious placement of a-b planar barriers around the film's perimeter can be accomplished in appropriately congruous fashion along the edges regardless of whether such edges are straight or curved.

In the example depicted in FIG. 4, rectangular film $L_{ap}$ includes four elongate rectangular a-axis-aligned film domains $d_1$, $d_2$, $d_3$ and $d_4$ and an interior rectangular film domain $d_5$. Film domain $d_5$ has a rectangular shape similar to that of the entire film $L_{ap}$. Each domain d differs from at least one other domain d in at least one respect. The a-b planes $p_{a-b}$ in domains $d_1$ and $d_2$ are approximately parallelly arranged; that is, the a-b planes $p_{a-b}$ in domains $d_1$ and $d_2$ lie in about the same b-c-planar orientation relative to substrate surface s. Similarly, the a-b planes $p_{a-b}$ in domains $d_3$ and $d_4$ are approximately parallelly arranged; that is, domains $d_3$ and $d_4$ lie in about the same b-c-planar orientation relative to substrate surface s. Hence, the a-b planes $p_{a-b}$ in domains di and $d_2$ are oriented in a different direction (actually, a perpendicular direction) in comparison with the a-b planes $p_{a-b}$ in domains $d_3$ and $d_4$.

Still with reference to FIG. 4, patterned HTS film $L_{ap}$ can be intra-patterned (i.e., intra-differentiatedly patterned) and/or inter-patterned (i.e., inter-differentiatedly patterned). Regardless of whether inventive practice involves a non-patterned a-axis-aligned film film $L_a$, or a patterned a-axis-aligned film (wherein film $L_{ap}$ is intra-patterned, inter-patterned or both intra-patterned and inter-patterned), generally every a-b plane $p_{a-b}$ in an a-axis-aligned film or film domain will describe approximately the same approximately perpendicular a-axial orientation relative to the substrate surface s.

If film $L_{ap}$ is intra-patterned only, then the entire film $L_{ap}$ is a-axis-aligned, but at least two domains d having a-axis-aligned a-b planes $p_{a-b}$ differ insofar as having a-axis-aligned a-b planes $p_{a-b}$ describing different b-axial orientations relative to substrate surface s (which is parallel to the b-c planes), albeit all of the a-b planes in film $L_{ap}$ describe approximately perpendicular a-axial orientations relative to substrate surface s. If film $L_{ap}$ is inter-patterned only, then the film $L_{ap}$ is partly a-axis-aligned and partly c-axis-aligned (in other words, has respective a-axis-aligned and c-axis-aligned domains), but every portion of film $L_{ap}$ which is a-axis-aligned describes the same b-axial orientation relative to substrate surface s, and every portion of film $L_{ap}$ which is c-axis-aligned describes the same b-axial orientation relative to substrate surface s.

If film $L_{ap}$ is intra-patterned, then film $L_{ap}$ can be either a-axis intra-diferentiatedly intra-patterned and/or c-axis intradifferentiatedly intra-patterned. If a film $L_{ap}$ is a-axis intra-diferentiatedly intra-patterned, then at least two domains d having a-axis-aligned film differ insofar as having a-b planes $p_{a-b}$ describing different b-axial orientations relative to substrate surface s. If a film $L_{ap}$ is c-axis intra-diferentiatedly intra-patterned, then at least two domains d having c-axis-aligned film differ insofar as having b-c planes $p_{b-c}$ describing different b-axial orientations relative to substrate surface s, albeit that generally every b-c plane $p_{b-c}$ in a c-axis-aligned film domain will describe approximately the same approximately perpendicular c-axial orientation relative to the substrate surface s. If a film $L_{ap}$ is both a-axis intra-diferentiatedly intra-patterned and c-axis intra-diferentiatedly intra-patterned, then both conditions apply. Usually, in the context of inventive practice, a-axis intra-diferentiatedly intra-patternedness will be much more important than c-axis intra-diferentiatedly intra-patternedness.

Generally preferred inventive practice provides that the inventively patterned film be either (i) a-axis intra-diferentiatedly intra-patterned or (ii) both inter-patterned and a-axis intra-diferentiatedly intra-patterned. FIG. 4 illustrates these two genres of preferred embodiments in accordance with the present invention. According to either inventive genre, it is desirable to at least substantially surround or circumscribe the interior of film $L_{ap}$ whereby one or more a-axis-aligned film domains d are so placed as to have their a-b planes $p_{a-b}$ positioned in parallel with the corresponding edge e portion, such a-b planes $p_{a-b}$ thereby serving to blockade the particularly intense incoming vortex v motion which penetrates inward from the outside periphery.

FIG. 4 exemplifies this inventive principle of peripheral blockading for a film $L_{ap}$ which is rectangular. Film $L_{ap}$ includes four a-axis-aligned film domains $d_1$, $d_2$, $d_3$ and $d_4$ around the periphery thereof, each domain d contiguously corresponding to one of the four linear edges e of rectangular film $L_{ap}$. The a-b planes $p_{a-b}$ encompassed by domain $d_1$ are approximately parallel to edge $e_1$. The a-b planes $p_{a-b}$ encompassed by domain $d_2$ are approximately parallel to edge $e_2$. The a-b planes $p_{a-b}$ encompassed by domain $d_3$ are approximately parallel to edge $e_3$. The a-b planes $p_{a-b}$ encompassed by domain $d_4$ are approximately parallel to edge $e_4$. Rectangular, centrally located domain $d_5$ is depicted in FIG. 4 as a hatched region so as to represent that inventive practice permits domain $d_5$ to comprise practically any kind of film.

It is more ideally preferable that film domain $d_5$ comprise a-axis-aligned HTS material, thereby further inhibiting vortex v motion. These inventive embodiments are of the first inventive genre noted hereinabove, viz., having a film $L_{ap}$ which is a-axis intra-diferentiatedly intra-patterned. According to such inventive embodiments, the a-b planes $p_{a-b}$ encompassed by-domain $d_5$ can be oriented in parallel with the a-b planes $p_{a-b}$ encompassed by domains $d_1$ and $d_2$, and hence in perpendicularity with the a-b planes $p_{a-b}$ encompassed by domains $d_3$ and $d_4$. Or, the a-b planes $p_{a-b}$ encompassed by domain $d_5$ can be oriented in parallel with the a-b planes $p_{a-b}$ encompassed by domains $d_3$ and $d_4$, and hence in perpendicularity with the a-b planes $p_{a-b}$ encompassed by domains $d_1$ and $d_2$. Or, the a-b planes $p_{a-b}$ encompassed by domain $d_5$ can be oriented in oblique fashion with respect to the a-b planes $p_{a-b}$ encompassed by each of domains $d_1$, $d_2$, $d_3$ and $d_4$. However, such inventive embodiments may prove too impractical or expensive, and hence inventive practice may tend to lean toward the second inventive genre noted hereinabove, viz., having a film $L_{ap}$ which is both inter-patterned and a-axis intra-diferentiatedly intra-patterned.

According to inventive embodiments belonging to the second inventive genre, the periphery (or a substantial portion thereof) is lined with a-axis-aligned HTS material, but a significant, interior portion of the overall film $L_{ap}$ includes c-axis-aligned HTS material. Hence, as exemplified in FIG. 4, domains $d_1$, $d_2$, $d_3$ and $d_4$ are each a-axis-aligned, while domains $d_5$ is c-axis-aligned. According to many embodiments belonging to this inventive genre, it is more practical and/or less expensive to grow a film $L_{ap}$ which is predominately c-axis-aligned but at the same time is a-axis-aligned in the peripheral areas which are key for purposes of inhibiting vortex v motion. Thus, many second genre inventive embodiments will prove to be largely or nearly as effective as first genre inventive embodiments would be if similarly practiced or applied. It is readily appreciated from FIG. 4 that this inventive combination of a-axis and c-axis morphologies will also work against vortices v, since vortex v penetration always proceeds and infiltrates from the edges e.

As shown in FIG. 4, approximately half (fifty percent) of the surface area (or volume) of film $L_{ap}$ comprises film domains $d_1$, $d_2$, $d_3$ and $d_4$ (which are peripherally located in film $L_{ap}$), and approximately half (fifty percent) of the surface area (or volume) of film $L_{ap}$ comprises film domain $d_5$ (which is centrally located in film $L_{ap}$. According to typical inventive practice of either inventive genre of patterned HTS film $L_{ap}$, at least about half of the surface area (or volume) of film $L_{ap}$ comprises HTS film material which is not-the peripheral a-axis-aligned HTS film material describing a-b vortex-impeding planes situated parallel to and proximate the edges e of film $L_{ap}$. Otherwise expressed, no more than about half of the surface area (or volume) of film $L_{ap}$ comprises HTS film material which is the peripheral a-axis-aligned HTS film material describing a-b vortex-impeding planes situated parallel to and proximate the edges e of film $L_{ap}$. This fifty-percent guideline, which may be considered in terms of either surface area or volume of the film, may be especially propitious for second genre embodiments according to this invention, since the centrally located c-axis-aligned material will usually be more easily and less expensively manufactured than the peripherally located a-axis aligned material.

According to typical inventive practice of "patterned" HTS film-based electronic devices, the patterned film $L_{ap}$ will be grown upon the substrate surface s in selected distinct (usually, small) domains. In the light of this disclosure, the fabrication of inventive films can be practiced by the ordinarily skilled artisan. Known methodologies and techniques for growing HTS films on substrates can be brought to bear by the inventive practitioner who reads this disclosure and exercises ordinary skill in the art. Thus, the first genre (a-axis intra-diferentiatedly intra-patterned) of patterned film according to this invention describes a film which is a-axis-aligned at least substantially in its entirety but which differs (e.g., orientatively) in at least two a-axis-aligned film domains. That is, a first genre inventively patterned film includes at least one a-axis-film domain of a first kind and at least one a-axis-film domain of a second kind; each of the distinct a-axis-aligned domains can be separately grown upon the substrate. Similarly, the second genre (both inter-patterned and a-axis intra-diferentiatedly intra-patterned) of patterned film according to this invention describes a film which at least substantially in its entirety is either a-axis-aligned or c-axis-aligned, thereby differing in at least two film domains in the respect that one domain is a-axis-aligned and the other domain is c-axis-aligned, also differing (e.g., orientatively) in at least two a-axis-aligned film domains. That is, a second genre inventively patterned film includes at least one c-axis-film domain, at least one a-axis-film domain of a first kind and at least one a-axis-film domain of a second kind; again, each of the distinct domains, either a-axis-aligned or c-axis-aligned, can be separately grown upon the substrate.

In the present state of the art, the growth of a-axis-aligned films is a difficult task. A-axis-aligned films have also been referred to as "a-axis films" and "a-axis-oriented films." Large-scale growth of a-axis films is in the earlier, rather experimental stages, and still represents an as yet largely unmet challenge. Notable among the published approaches thus far taken are those that essentially use an anatomically flat $SrTiO_3$ substrate, with or without a suitable buffer layer. Such films can be grown on areas on the order of micron$^2$, which approach typical areas in HTS film-based devices. Details on three different rather experimental procedures for the growth of such a-axis-aligned films are disclosed in the following references, each of which is incorporated herein by reference: R. Tsuchiya et. al., "$YBa_2Cu_3O_{7-\delta}$Trilayer Junction With nm Thick $PrGaO_3$ Barrier," *App. Phys. Lett.* 71(11), pp 1570–1572 (September 1997); F. Miletto Granozio et. al., "Competition between a-axis and c-axis Growth in Superconducting $RBa_2Cu_3O_{7-x}$ Thin Films," *Physical Review B* 61, No. 1, pp 756–765 (January 2000); G. Deutscher and D. Racah, "Tunneling Density of States in a-axis YBCO Films," *Proceedings of the SPIE—Int. Soc. Opt. Eng.*, Vol. 2696, pp 328–337 (1996). See also the following references, each of which is incorporated herein by reference: R. Krupke and G. Deutscher, "Anisotropic Magnetic Field Dependence of the Zero-Bias Anomalyon In-Plane Oriented [100]$Y_1Ba_2Cu_3O_{7-x}$/ In Tunnel Junctions," *Phys. Rev. Lett.* 83, No. 22, pp 4634–4637 (Nov. 29, 1999); Krupke and G. Deutscher, "Spontaneous and Field Enhanced Sub-Gaps in In-Plane Oriented (100)—$Y_{1-x}Ca_xBa_2Cu_3O_{7-y}$/ In Tunnel Junctions," *Jour. Low Temp. Phys.* 117, Nos. 3/4, pp 533–537 (1999); C. B. Eom, A. F. Marshall, S. S. Laderman, R. D. Jacowitz and T. H. Geballe, *Science* 249, starting p 1549 (1990); I. Takeuchi, P. A. Warburton, Z. Trajanovic, C. J. Lobb, Z. W. Dong, T. Venkatesan, M. A. Bari, W. E. Booij, E. J. Tarte and M. G. Blamire, "Fabrication of In-Plane Aligned a-axis Oriented $YBa_2Cu_3O_{7-x}$ Trilayer Josephson Junctions," *Appl. Phys. Lett.* 69 (1), pp 112–114 (Jul. 1, 1996); F. Miletto Granozio, M. Salluzzo, U. Scotti di Uccio, I. laggio-Aprile and O. Fischer, "Competition between a-axis and c-axis Growth in Superconducting $RBa_2Cu_3O_{7-x}$ Thin Films," *Physica Review B* 61(1), pp 756–765 (Jan. 1, 2000); J. Mannhart, J. G. Bednorz, A. Catana, Ch. Gerber and D. G. Schlom, "High-$T_c$ Thin Films. Growth Modes—Structure—Applications," *Materials and Crystallographic Aspects of $HT_c$-Superconductivity*, pp $453_{14\ 470}$ (1994); You-song Jiang, Tadayuki Kobayashi and Toshinari Goto, "Josephson Effects in A-axis Oriented $YBa_2Cu_3O_{7-y}$ SIS Tunnel Junctions with Double Layer Barrier," *Physica C* 341–348, pp 2741–2742 (2000); M. Mukaida et al., *Physica C* 357–369 (1–4), pp 1382–1385 (2001); M. Mukaida et al.,*Jpn. J. Appl. Phys.* 38, Part 1, No. 3A, pp. 1370–1374 (Mar. 15, 1999); R. G. Wichern, *IEEE Trans. Applied Superconductivity* 5 (2), pp 2361–2364 (1995); C. Ballesteros et al., *Thin Solid Film* 373 (1–2), pp 113–116 (September 2000); N. Tanicki et al., *Physica C* 293, pp 229–233 (1997); Hae-Ryong Lin et al., *Proceedings of the Eighth Korean Conference on Materials and Applications of Superconductivity*, Aug. 19–21, 1998, Yong Pyang, Kangwondo, Korea, pp 188–189 (1998).

Inventive practice of homogeneous and patterned a-axis-aligned HTS films is not intended by the inventor to supplant, but rather to complement other design parameters and considerations which are already known in the art. For instance, the known practice of doping the HTS film with impurities can enhance its characteristics. Nevertheless, unlike the present invention, none of the prior art parameters and considerations have addressed the issue of noise level. Generally, the exercise of ordinarily skill in practicing the present invention will succeed in optimizing performance of the superconducting device not only in respect to ELF noise and white noise, but in other respects, as well.

The inventor has considered alternative methodologies for reducing or minimizing low-frequency and white noise in situations wherein c-axis-aligned film, only, is the superconductor film of choice in the superconductor device. Among these alternative approaches considered by the inventor are to deposit only narrower c-axis film strips and/or to put holes ("anti-dots") in the strips. These geometric modifications are intended to "flush-out" vortices that penetrated the structure. However, a quantitative basis for these approaches is lacking.

Of particular note is an approach devised by the inventor wherein "thick-narrow c-films" are utilized. The c-axis film stripes are grown and shaped as thick and as narrow as possible in comparison to the penetration depth or length. This proposition is based on recent calculations by the inventor. The principle of this design is based on the fact that in such films the surface barrier, which contains the vortex inside the film, is "low." Consequently, a vortex that has penetrated such a film cannot survive there for long since there is no potential well to keep it there. See the following papers co-authored by the inventor and incorporated herein by reference: D. Agassi and J. R. Cullen, "Superconductor Strip Geometrical Barrier in the Presence of a Normally Incident Weak Field," *Physica C* 341–348, pp 1257–1258 (November 2000); D. Agassi and J. R. Cullen, "Single-Vortex Structure in a Superconductor Film and Strip," *Physica C* 334, pp 274–282 (2000); D. Agassi and J. R. Cullen, "Superconductor Strip Geometrical Barrier in the Presence of a Weak Applied Field," *Physica C* 334, pp 259–273 (2000); D. Agassi and J. R. Cullen, "Superconductor Strip Response to a Normally Incident Magnetic Field," *Physica C* 323, pp 94–106 (1999); D. Agassi and J. R. Cullen, "New Vortex State in the Presence of a long Josephson Junction," *Physica C* 316, pp 1–12 (1999).

The present invention is premised on the proposition that low-frequency noise and white noise in SQUIDS, and other electronic devices (e.g., filters) which are based on high-temperature superconductors (HTS), result from random vortex motion in such devices. This invention provides for the use in such devices of novel HTS films comprising a-axis-aligned HTS material. Scientific studies, taken together with the laws of physics, imply that the superconductor films in accordance with the present invention will substantially reduce the ELF and white noises.

Many SQUID devices include a structure known as a "washer." See, e.g., John Clarke, "Superconductivity: A Macroscopic Quantum Phenomenon," Beam Line (A Periodical of Particle Physics), Stanford Linear Accelerator Center, Stanford, Calif., Summer/Fall 2000, Vol. 30, No. 2, pp 41–48, http://www.slac.stanford.edu/, incorporated herein by reference. The washer acts as a kind of antenna or amplifier so as to reduce the noise problem of the SQUID device; nevertheless, washers are only limitedly effective in reducing low frequency noise associated with SQUID devices.

Figure 5:
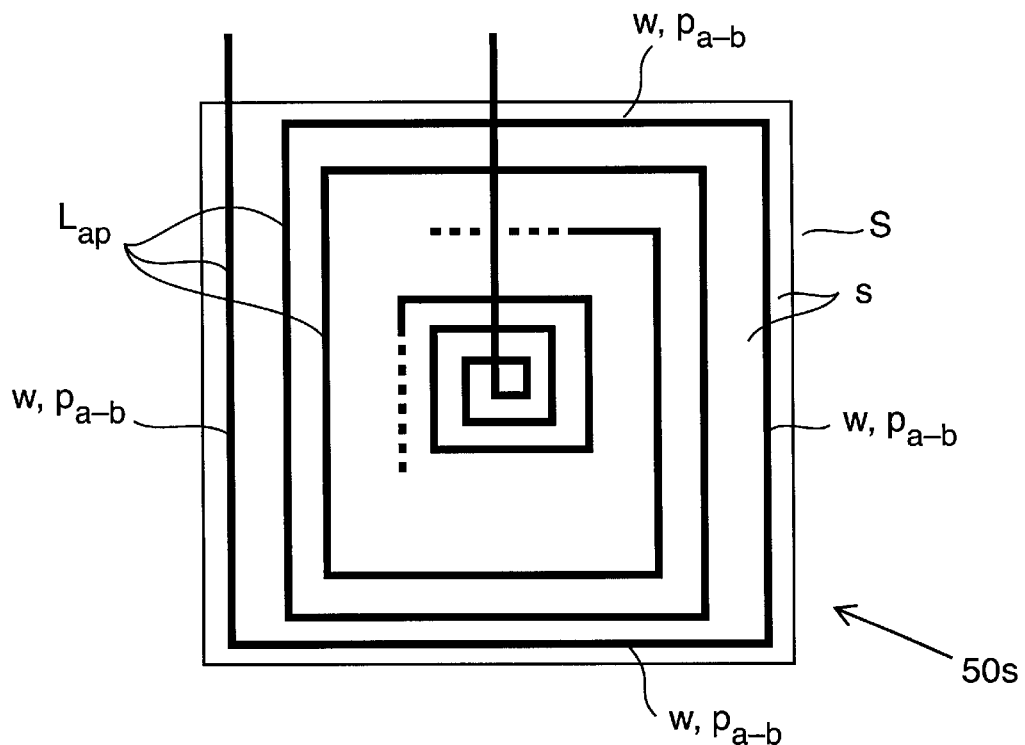
FIG. 5 is a diagrammatic top plan view of a typical washer configuration which is conventionally used in association with an HTS film and a substrate in HTS-film-based electronic devices.
Figure 6:
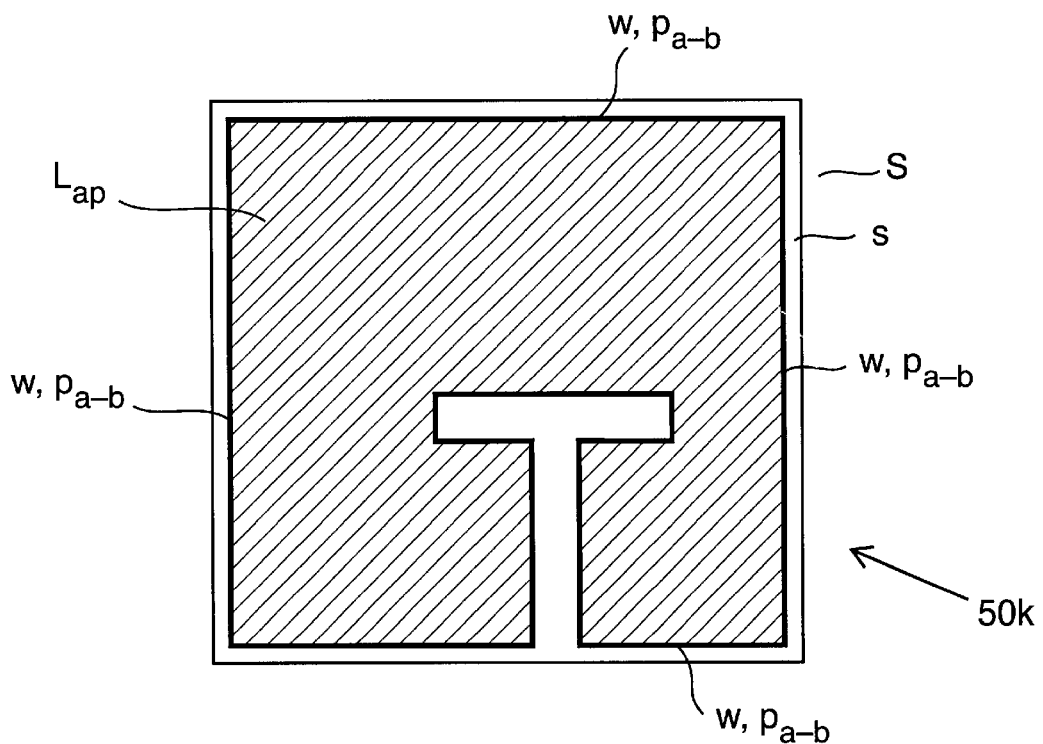
FIG. 6 is a diagrammatic top plan view of another typical washer configuration which is conventionally used in association with an HTS film and a substrate in HTS-film-based electronic devices.

Referring to FIG. 5 and FIG. 6, two typical washer configurations are the standard spiral washer 50s (shown in FIG. 5) and the Ketchen washer 50k (shown in FIG. 6). Each washer 50 comprises a substrate S (having a substrate surface s) and a superconducting film F. The term "substrate" is generically used herein to denote any object having a surface so as to be adaptable to having a superconducting film provided thereon. Hence, according to many SQUID devices, the SQUID device includes a first combination (of a substrate and a superconducting film) and a second combination (of a substrate and a superconducting film), whereby the second combination is superposed upon the first combination. The second combination is included in a washer 50.

As shown in FIG. 5 and FIG. 6, respectively, the superconducting film L of washer 50 is configured in outline according to a standard spiral design and a Ketchen design. The spiral design shown in FIG. 5 has indicia of film "strips," whereas the Ketchen design shown in FIG. 6 is less elongate or more continuous in nature. Regardless of the outline configuration of the superconducting film L—that is, regardless of the in-plane shape of the superconducting film L—the inventive principles are applicable; of particular note, the inventive principles of film patterning are applicable, regardless thereof. Therefore, according to inventive practice, as shown in either FIG. 5 or FIG. 6 the superconducting film L is inventively patterned film $L_{ap}$, wherein vortex-blocking walls w (each wall w including a-b planes $p_{a-b}$) are situated in generally parallel fashion along most or all of the outermost periphery of film $L_{ap}$.

Although the type of superconducting device known as a "SQUID" has been rather emphasized herein, it is to be understood that the principles of the present invention can apply to any superconducting device where flux noise is a sensitivity-limiting factor.

Other embodiments of this invention will be apparent to those skilled in the art from a consideration of this specification or practice of the invention disclosed herein. Various omissions, modifications and changes to the principles described may be made by one skilled in the art without departing from the true scope and spirit of the invention which is indicated by the following claims.

What is claimed is:

1. A combination which is adaptable to use in film-based high temperature superconductor electronic apparatus, said combination comprising a substrate and a film, said substrate having a substrate surface, said film including crystalline high temperature superconductor material, said film including at least three exterior film regions and an interior film region, said exterior film regions circumscribing said interior film region, said exterior film regions including a-axis-aligned high temperature superconductor material, said film being disposed on said substrate surface so that said a-axis-aligned high temperature superconductor material defines therein a plurality of a-b planes which are at least approximately perpendicular to said substrate, said exterior film regions differing from each other in terms of the b-axial orientation of said a-b planes relative to said substrate surface, said film at least approximately describing a geometric plane and a film outline, said geometric plane being at least approximately parallel to said substrate surface, said film outline lying in said geometric plane and defining an at least approximately polygonal shape, said film outline being formed by at least three at least approximately linear film outline edges, each said exterior film region being bounded by a corresponding said film outline edge, said b-axial orientation of said a-b planes of each said exterior film region being at least approximately parallel to the corresponding said film outline edge.

2. The combination defined in claim 1, wherein said a-axis-aligned high temperature superconductor material is Yttrium Barium Copper Oxide, and wherein said a-b planes are Copper-Oxide planes.

3. The combination defined in claim 1, wherein said interior film region includes c-axis-aligned high temperature superconductor material.

4. The combination defined in claim 3, wherein:
said a-axis-aligned high temperature superconductor material is Yttrium Barium Copper Oxide;
said a-b planes are Copper-Oxide planes; and
said c-axis-aligned high, temperature superconductor material is Yttrium Barium Copper Oxide.

5. The combination defined in claim 3, wherein said a-axis-aligned high temperature superconductor material is Yttrium Barium Copper Oxide, and wherein said a-b planes are Copper-Oxide planes.

6. The combination defined in claim 1, wherein said interior film region includes a-axis-aligned high temperature superconductor material.

7. A combination which is adaptable to use in film-based high temperature superconductor electronic apparatus, said combination comprising a substrate and a film, said substrate having a substrate surface, said film including a-axis-aligned crystalline high temperature superconductor material, said film being disposed on said substrate surface so that said a-axis-aligned high temperature superconductor material defines therein a plurality of a-b planes which are at least approximately perpendicular to said substrate, wherein:

said film includes a plurality of film regions;

at least two said film regions include said a-axis-aligned high temperature superconductor material and differ from each other in terms of the b-axial orientation of said a-b planes relative to said substrate surface;

said film describes a geometric plane and a film outline;

said geometric plane is at least approximately parallel to said substrate surface;

said film outline lies in said geometric plane;

said at least two said film regions abut at least substantially the entire said film outline;

each of said at least two said film regions defines therein at least one said a-b plane which is at least approximately parallel to said film outline;

said film includes c-axis-aligned high temperature superconductor material;

at least one said film region includes said c-axis-aligned high temperature superconductor material;

said at least one said film region which includes said c-axis-aligned high temperature superconductor material does not abut said film outline;

said at least one said film region which includes said c-axis-aligned high temperature superconductor material describes a regional boundary;

said regional boundary lies in said geometric plane;

said regional boundary is interior of said film outline;

said film outline describes a first at least approximately rectangular shape;

said regional boundary describes a second at least approximately rectangular shape;

said second at least approximately rectangular shape is geometrically at least approximately similar to said first at least approximately rectangular shape;

said film outline is at least approximately characterized by a first geometric center point lying in said geometric plane;

said regional boundary is at least approximately characterized by a second geometric center point lying in said geometric plane; and said first geometric center point and said second geometric center point are at least approximately coincident.

8. The combination defined in claim 7, wherein:

said a-axis-aligned high temperature superconductor material is Yttrium Barium Copper Oxide;

said a-b planes are Copper-Oxide planes; and said c-axis-aligned high temperature superconductor material is Yttrium Barium Copper Oxide.

9. A superconducting device comprising a substrate and a film upon said substrate, said film defining an at least approximately polygonal film perimeter, said film perimeter being formed by at least three at least approximately straight geometric sides, said film having a peripheral film portion and a central film portion, said peripheral film portion surrounding said central film portion, said peripheral film portion comprising a-axis-aligned superconducting material characterized by the formation of at least three at least approximately straight lattice walls describing a-axis-b-axis planes which are at least generally perpendicular to said substrate, wherein said lattice walls border upon at least substantially all of said film perimeter so as to be at least generally parallel with respect to said film perimeter, each said lattice wall bordering upon a corresponding said geometric side.

10. A superconducting device as recited in claim 9, wherein the geometric surface area of said peripheral film portion is no greater than the geometric surface area of said central film portion.

11. A superconducting device as recited in claim 9, wherein to some degree said lattice walls barricade random thermal motion vortices outside said central film portion, said lattice walls commensurately reducing the voltage noise of said superconducting device.

12. A superconducting device as recited in claim 11, wherein said central film portion comprises c-axis-aligned superconducting material.

13. A superconducting device as recited in claim 12, wherein at least one of said a-axis-aligned superconducting material and said c-axis-aligned superconducting material is $YBa_2Cu_3O_{7-\delta}$.

14. A superconducting device as recited in claim 12, wherein:

said film perimeter at least approximately describes a major rectangle;

said peripheral portion and said central portion describe a boundary therebetween; and said boundary at least approximately describes a minor rectangle that is smaller than and encompassed by said major rectangle.

15. A superconducting device comprising a substrate and a film upon said substrate, said film defining a film perimeter, said film comprising a-axis-aligned superconducting material characterized by the formation of plural lattice walls describing a-axis-b-axis planes which are at least generally perpendicular to said substrate, wherein:

said lattice walls border upon at least substantially all of said film perimeter so as to be at least generally parallel with respect to said film perimeter;

said film is characterized by a major dimensional film area encompassed by said film perimeter;

said a-axis-aligned superconducting material represents no more than approximately fifty percent of said major dimensional film area;

said film comprises c-axis-aligned superconducting material;

said c-axis-aligned superconducting material represents no less than approximately fifty percent of said major dimensional film area;

said film perimeter at least approximately describes a major geometric rectangle;

said a-axis-aligned superconducting material and said c-axis-aligned superconducting material describe an interior film boundary therebetween;

said film is characterized by a minor dimensional film area encompassed by said interior film boundary;

said minor dimensional film area is less than said major dimensional film area;

said interior film boundary at least approximately describes a minor geometric rectangle;

said major geometric rectangle and said minor geometric rectangle are at least approximately coplanar, at least approximately similar in geometric shape and at least approximately concentric.

16. A superconducting device as recited in claim 15, wherein at least one of said a-axis-aligned superconducting -material and said c-axis-aligned superconducting material is $YBa_2Cu_3O_{7-\delta}$.

17. Apparatus adaptable to utilization as part of a superconductor device, said apparatus comprising superconducting film and a substrate therefor, said superconducting film at least substantially describing a planar geometric shape that is delimited by an outside film border, said superconducting film including a-axis superconducting film that at least substantially forms said outside film border, said a-axis superconducting film having a-b planar submolecular crystalline structures that are at least substantially normal to said substrate, said a-b planar submolecular structures being so arranged as to form blockade means along said outside film border, said blockade means being characterized by at least substantial parallelism with respect to to said outside film border.

18. Apparatus as defined in claim 17, wherein said a-axis superconducting film at least essentially consists of $YBa_2Cu_3O_{7-\delta}$, and wherein said a-b planar submolecular structures are Cu—O submolecular structures.

19. Apparatus as defined in claim 17, said superconducting film further including c-axis superconducting film that is at least substantially interior of said a-axis superconducting film.

20. Apparatus as defined in claim 19, wherein at least one of said a-axis superconducting film and said c-axis superconducting film at least essentially consists of $YBa_2Cu_3O_{7-\delta}$.

21. The combination defined in claim 1, wherein:
vortices are generated in the vicinity of said film when said combination is used in said film-based high temperature superconductor electronic apparatus;
voltage noise of said film-based high temperature superconductor electronic apparatus is associated with said vortices;
said a-b planes of said exterior film regions together form a barrier to said vortices; and
said barrier at least substantially prevents said vortices from reaching said interior film region, said barrier thereby attenuating said voltage noise.

22. The combination defined in claim 3, wherein:
vortices are generated in the vicinity of said film when said combination is used in said film-based high temperature superconductor electronic apparatus;
voltage noise of said film-based high temperature superconductor electronic apparatus is associated with said vortices;
said a-b planes of said exterior film regions together form a barrier to said vortices; and
said barrier at least partially prevents said vortices from reaching said interior film region, said barrier thereby attenuating said voltage noise.

23. The combination defined in claim 6, wherein:
vortices are generated in the vicinity of said film when said combination is used in said film-based high temperature superconductor electronic apparatus;
voltage noise of said film-based high temperature superconductor electronic apparatus is associated with said vortices;
said a-b planes of said exterior film regions together form a barrier to said vortices; and
said barrier at least partially prevents said vortices from reaching said interior film region, said barrier thereby attenuating said voltage noise.

24. A superconducting device as recited in claim 11, wherein said central film portion comprises a-axis-aligned superconducting material.

25. Apparatus as defined in claim 17 wherein, during said utilization of said apparatus:
vortices tend to exist proximate said outside film border;
said vortices tend to give rise to voltage noise of said superconductor device;
said blockade means obstructs the inward penetration of said vortices into said superconducting film; and
said obstructing results in a decreased amount of said voltage noise.

* * * * *